United States Patent [19]

Gilbert

[11] Patent Number: 5,489,868
[45] Date of Patent: Feb. 6, 1996

US005489868A

[54] DETECTOR CELL FOR LOGARITHMIC AMPLIFIERS

[75] Inventor: Barrie Gilbert, Portland, Oreg.

[73] Assignee: Analog Devices, Inc., Norwood, Mass.

[21] Appl. No.: 317,811

[22] Filed: Oct. 4, 1994

[51] Int. Cl.⁶ .............................. G06F 7/556; G06G 7/20; H03K 5/22
[52] U.S. Cl. ................ 327/351; 327/350; 327/65; 327/52
[58] Field of Search .................................. 327/350, 351, 327/352, 51, 52, 63, 65, 66

[56] References Cited

U.S. PATENT DOCUMENTS

| | | | |
|---|---|---|---|
| 3,668,535 | 6/1972 | Lansdowne | 327/351 |
| 4,980,581 | 12/1990 | Esgar et al. | 327/63 |
| 5,049,829 | 9/1991 | Garskamp et al. | 327/351 |
| 5,057,717 | 10/1991 | Kimura | 327/351 |
| 5,298,811 | 3/1994 | Gilbert . | |
| 5,345,185 | 9/1994 | Gilbert | 327/350 |
| 5,414,313 | 5/1995 | Crescenzi, Jr. et al. | 327/351 |

OTHER PUBLICATIONS

Gilbert, Barrie, "Current-mode Circuits From A Translinear Viewpoint: A Tutorial" from *Analogue IC Design: The Current-mode Approach*, Toumazou, Lidgey, Haigh, eds. Peter Peregrinus, Ltd., London 1990.

*Primary Examiner*—Toan Tran
*Attorney, Agent, or Firm*—Marger, Johnson, McCollom & Stolowitz

[57] ABSTRACT

A detector cell for a logarithmic includes a differential pair of inputs across which a input signal $V_0$ is applied across. The detector cell also includes a pair of differential outputs. The detector cell is comprised of three transistors Q4, Q5 and Q6. Resistors are coupled between the bases of adjacent transistors. The resistors form a voltage divided across which the input signal $V_0$ is divided. The emitters of the three transistors are coupled to a current source, which sends a predetermined amount of current Ihd D. The collectors of the first and third transistors are coupled together to form a first differential input of the differential input pair. The collector of the second transistor alone forms the second differential input of the pair. The emitter area of the second transistor is ratioed with respect to the first and third so that a current $I_1$ flowing through the first differential output is equal to a current $I_2$ flowing through the second differential output when no input signal is applied across the differential inputs of the detector. A difference amplifier is coupled to the differential outputs to compare the currents $I_1$ and $I_2$ flowing therethrough. The difference amplifier produces an output current $I_{OUT}$ that is proportional to the difference between the two currents $I_1$ and $I_2$. Because currents $I_1$ and $I_2$ are equal when no input signal is detected, the difference amplifier produces an output current $I_{OUT}$ that is approximately zero. A load resistor is coupled to output of the difference amplifier to convert the current $I_{OUT}$ to the desired output voltage signal $V_{RSSI}$.

20 Claims, 4 Drawing Sheets

DETECTOR CELL FOR LOGARITHMIC AMPLIFIERS

BACKGROUND OF THE INVENTION

This invention relates generally to logarithmic amplifiers, and, more particularly, to a multi-stage logarithmic amplifier of the "progressive-compression" type including a multi-stage detector circuit.

Progressive-compression type logarithmic amplifiers are well-known in the art and are widely employed to provide high-speed response to signals having a large dynamic range, often in applications where an automatic gain control circuit would be inapplicable due to its slow response to changes in signal amplitude. Progressive-compression type logarithmic amplifiers synthesize a logarithmic function to progressive compression of an input signal over many amplifier stages (typically 5 to 10). Each amplifier stage has a relatively low linear gain, (typically 2 to 4) up to some critical level. Above the critical level the incremental gain of the amplifier stage is reduced, and in some cases is zero.

An example of a prior art progressive-compression type logarithmic amplifier is shown in FIG. 1. The logarithmic amplifier 10 of FIG. 1 includes a plurality of serially connected gain stages 14–20. The gain stages produce an output signal $V_{OUT}$ at an output terminal 22 that is proportional to the logarithm, i.e., the decibel magnitude, of an input signal $V_{IN}$ received at the logarithmic amplifier input 12.

The logarithmic amplifier also includes a plurality of detector cells 24–32. The detector cells 26–32 are coupled to the output of a corresponding gain stage to determine the signal strength of a signal produced thereby. An additional detector 24 as shown in FIG. 1, can be coupled to the input of the first gain stage 14 to determine the signal strength of the input signal $V_{IN}$. Each of the detector cells produce an output signal that is proportional to the signal strength detected thereby. The outputs of the detectors are then summed together to determine the overall signal strength of the signal generated by the logarithmic amplifier 10. In the embodiment shown in FIG. 1, the detector cells produce a current output, by using a transconductance element, therefore the summation is accomplished by coupling the detector outputs to a current bus 34. The current $I_{LOG}$ produced on the current bus 34 is a logarithmic function of the signal strength of the input signal $V_{IN}$. This current $I_{LOG}$ is then converted to a voltage $V_{RSSI}$, where RSSI stands for received signal strength indicator, by coupling a load resistor 38 between the current bus 34 and ground. Alternatively, the resistor can be implemented by a transresistance stage. It should be noted that detector stages 24–32 can be implemented having a voltage output. In that case, a separate voltage summing circuit, rather than a simple current bus, is required to add the detector voltage outputs.

The output signal $V_{RSSI}$ produced by the detector cells, as the name indicates, is an indication of the received signal strength of the input signal $V_{IN}$. In portable phone applications, for example, this signal $V_{RSSI}$ can be used to modulate both the power of the handset as well as the transmitter station. When the signal $V_{RSSI}$ indicates that the received signal strength is low, the hand-held receiver can indicate to the station that more transmit power is required. At the same time, transmit power should be kept at a minimum to minimize CO-channel interference which is interference produced by two stations covering adjacent geographical regions transmitting at the same frequency. The signal $V_{RSSI}$ can also be used by the handset to modulate its transmit power based on the signal level. The handset transmit power is roughly inversely proportional to the $V_{RSSI}$ signal level. The handset transmit power must also be kept to a minimum to avoid excessive power consumption in the handset. Minimizing the power consumption in the handset is particularly important because most handsets operate on batteries which have a finite amount of power storage.

An example of a prior art detector cell is shown in FIG. 2. The detector cell 24, which corresponds to detector cell 24 of FIG. 1, includes three transistors (Q1–Q3). The transistors are bipolar junction transistors (BJT) with the second transistor Q2 having an emitter area (De) equal to a multiple (D) of the emitter areas (e) of transistors Q1 and Q3. A first resistor $R_B$ is coupled between the bases of the first and second transistors Q1 and Q2 and a second transistor $R_B$ is coupled between the bases of transistors Q2 and Q3. The emitters of transistors Q1–Q3 are coupled to a current source supplying a current $I_D$ to the detector circuit. The collectors of Q1 and Q3, 40 and 44, respectively, can be coupled to a load or a supply voltage, as is known in the art. The collector 42 of transistor Q2 forms the output of the detector cell. The base of transistor Q1 forms a first input 46 of the detector cell and the base of register Q3 forms a second input 48 of the detector cell.

In operation, as a signal $V_0$ applied to detector inputs 46 and 48 swings positive or negative, the use of the resistor divider formed by the two resistors $R_B$ results in one of the two outer transistors Q1 and Q3 conducting more heavily. The form of the resulting collector currents in transistors Q1 and Q3 is approximately a hyperbolic cosine. Thus, the output current $I_{OUT}$ flowing through the second transistor Q2 is equal to the difference between the current $I_D$ and the collector currents of the transistors Q1 and Q3. The resulting output current $I_{OUT}$ as a function of the input signal $V_0$ is shown in FIG. 3. As is apparent from FIG. 3, the output current $I_{OUT}$ is maximum when no input signal $V_0$ is applied to the detector cell. The magnitude of the output current at this maximum point is equal to $I_D \times (D/2+D)$. This behavior results in undesirable power consumption when no signal is being detected. This effect is multiplied for each one of the detector cells. The cumulative effect of this output current results in lower battery life in the handset.

Accordingly, a need remains for a detector cell that does not produce an output current when no signal is being detected.

SUMMARY OF THE INVENTION

It is, therefore, an object of the invention to provide a detector which does not produce an output current when no signal is detected.

The detector according to the invention modifies the basic prior art detector cell described above by coupling the collectors of the first and third transistors together to form a first differential output of the detector cell. The collector of the second transistor forms a second differential output of the detector cell. The emitter area of the second transistor is ratioed with respect to the first and third transistors so that the current flowing in the first and second differential outputs is substantially equal when no signal is applied to the detector cell. A difference amplifier is coupled to the first and second differential inputs to compute the differences in the current thereat. Because the currents are equal when no signal is applied to the detector cell, the difference amplifier produces no output current when no signal is applied to the detector cell. Additional detector cells can also be coupled to the difference amplifier in a substantially similar manner so that the overall output of the detector cells is also zero when no signal is detected thereby.

In another aspect of the invention, additional detector cells are coupled to the input of the logarithmic amplifier in which the detector cells are employed. The additional detector cells are coupled to the logarithmic amplifier input via an impedance network in order to increase the operating range of the logarithmic amplifier. The impedance network attenuates the input signal applied to the logarithmic amplifier input to allow the additional detectors to detect larger input signals and thereby increase the operating range of the detector cells.

The foregoing and other objects, features and advantages of the invention will become more readily apparent from the following detailed description of a preferred embodiment of the invention which proceeds with reference to the accompanying drawings.

DETAILED DESCRIPTION

Figure 1:
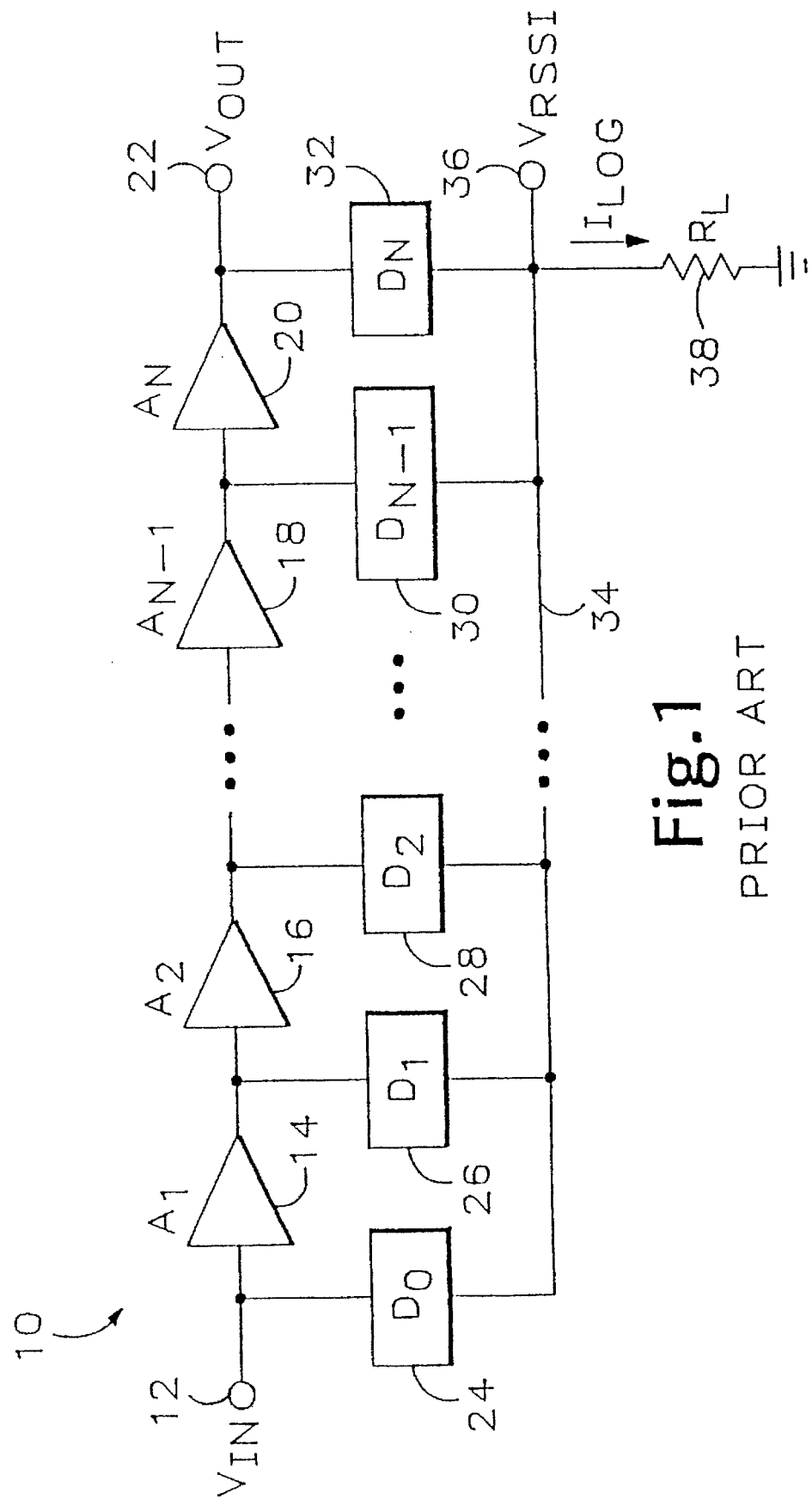
FIG. 1 is a block diagram of a prior art logarithmic amplifier.
Figure 2:
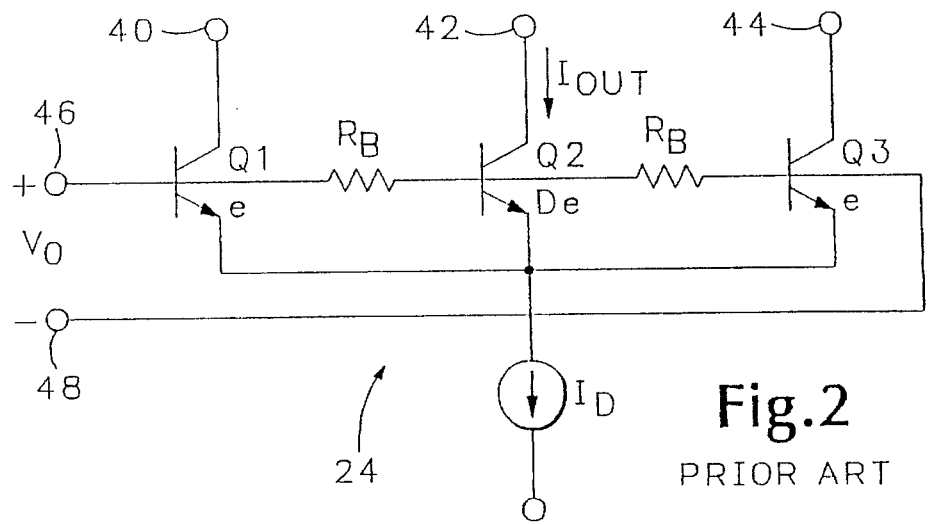
FIG. 2 is a schematic of a prior art detector cell for the logarithmic amplifier of FIG. 1.
Figure 3:
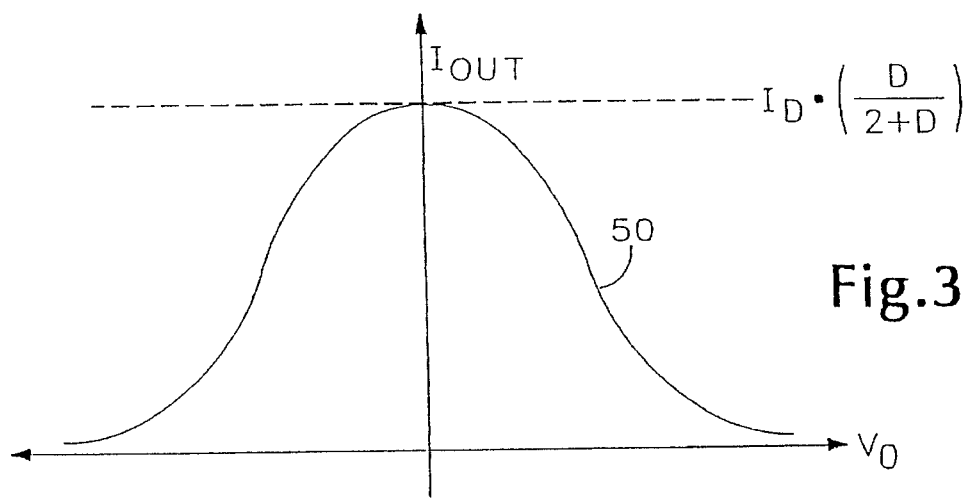
FIG. 3 is a plot of the current output of the detector of FIG. 2 as a function of an input voltage applied thereto.
Figure 4:
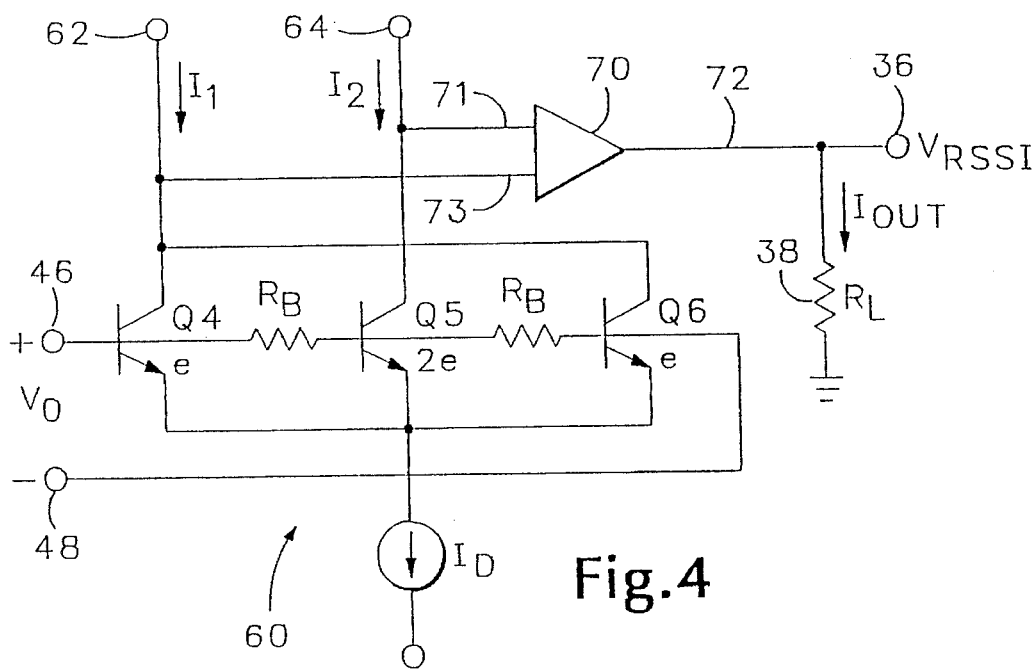
FIG. 4 is a schematic of a detector cell according to the invention.

Referring now to FIG. 4, a detector cell 60 according to the invention is shown. The detector cell includes a differential pair of inputs 46 and 48 across which a input signal $V_0$ is applied across. This input signal $V_0$ is the signal which is detected by the detector cell 60. The detector cell also includes a pair of differential output 62 and 64. The detector cell is comprised of three transistors Q4, Q5 and Q6. As in the prior art, resistors are coupled between the bases of adjacent transistors. The resistors form a voltage divider across which the input signal $V_0$ is divided. The emitters of the three transistors are coupled to a current source $I_D$, which supplies a predetermined amount of current $I_D$ thereto.

Unlike the prior art detector cell, the collector of transistor Q6 is coupled to the collector of transistor Q4, which together form the first differential output 62 of the differential pair. The collector of transistor Q5 alone forms the second differential output 64 of the pair.

The emitter area of the transistor Q5 is ratioed with respect to transistors Q4 and Q6 so that a current $I_1$ flowing through the first differential output 62 is equal to a current $I_2$ flowing through the second differential output 64 when no input signal is applied across the differential inputs 46 and 48. It can be shown that the ratio of the emitter area of Q5 (2e) to the emitter area of Q4 and Q6 (e) must be equal to 2:1 in order for this condition to be met.

A difference amplifier 70 is coupled to the differential outputs 62 and 64 to compare the currents $I_1$ and $I_2$ flowing therethrough. The difference amplifier produces an output current $I_{OUT}$ on a conductor 72 that is proportional to the difference between the two currents $I_1$ and $I_2$. The load resistor 38 can be coupled to the conductor 72 to convert the current $I_{OUT}$ to the desired output voltage signal $V_{RSSI}$ at terminal 36.

Figure 5:
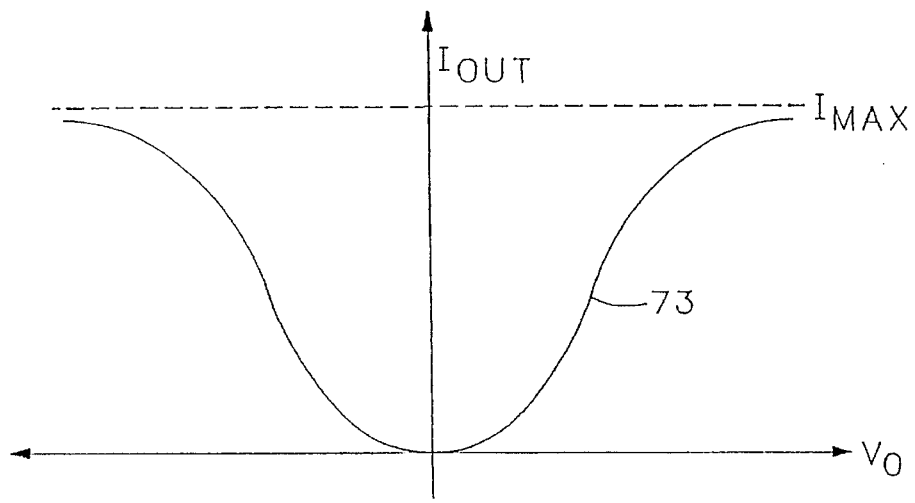
FIG. 5 is a plot of the current output of the detector cell of FIG. 4 as az function of the signal voltage applied thereto.

Alternatively, a transresistance element can be used. The operation of the detector cell 60 and the difference amplifier 70 can clearly be seen upon examination of FIG. 5. In FIG. 5, the output current $I_{OUT}$ is plotted as a function of the voltage $V_0$ applied across the differential inputs 46 and 48. As is evidenced by the plot, the output current $I_{OUT}$ is approximately zero when no input voltage is applied to the detector cell. As a result, the undesirable power consumption of the prior art detector cell is substantially eliminated.

Figure 6:
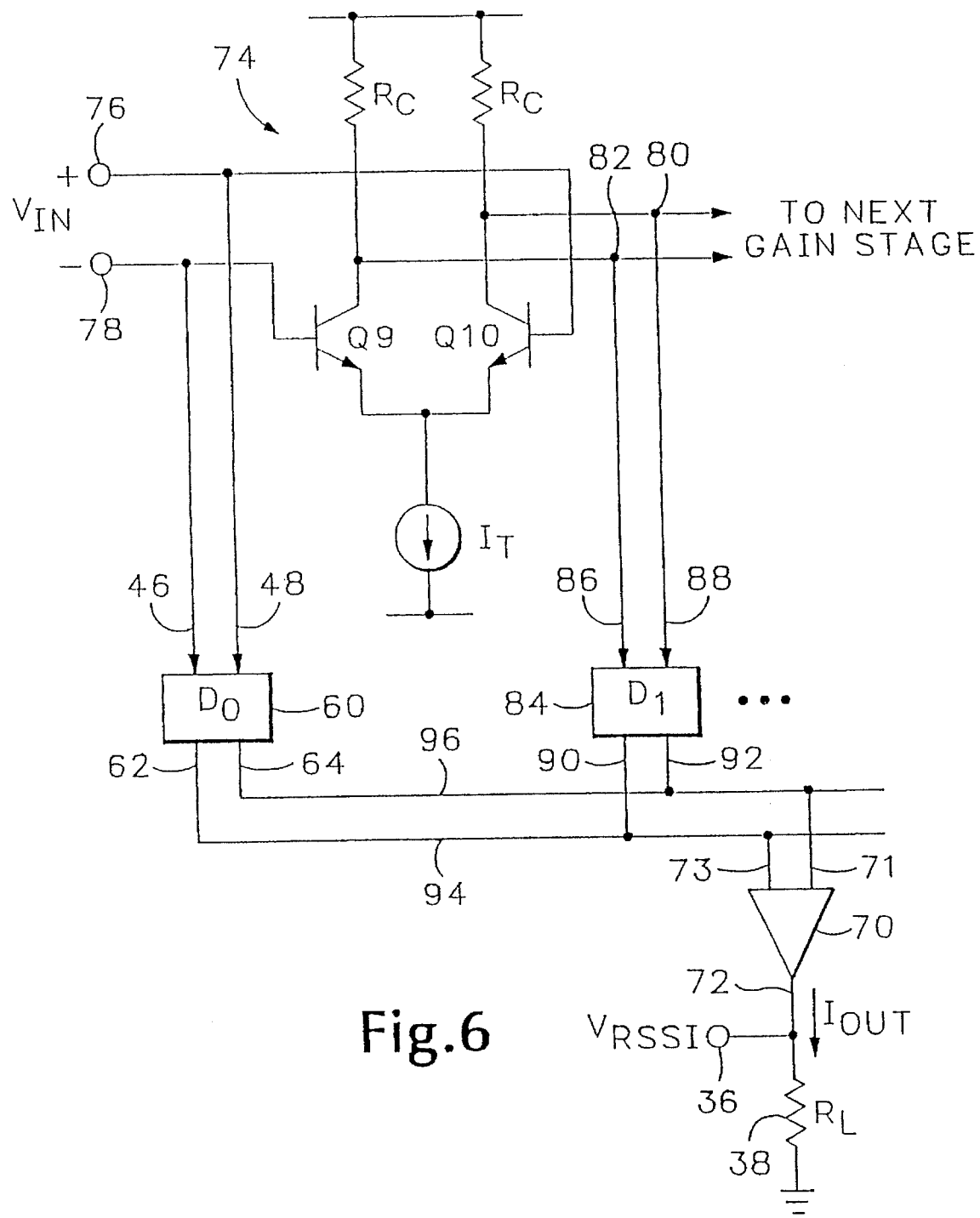
FIG. 6 is a schematic diagram of a portion of a logarithmic amplifier using the detector cell of FIG. 4.

A portion of a logarithmic amplifier according to the invention is shown in FIG. 6. The logarithmic amplifier of FIG. 6 includes but a single gain stage 74, which is a conventional differential pair. The logarithmic amplifier also includes a plurality of additional gain stages, which are not shown for sake of simplicity. The logarithmic amplifier includes a pair of differential inputs 76 and 78 that are coupled to the first gain stage 74 in a conventional manner in order to provide an input signal $V_{IN}$ supplied thereto. The gain stage 74 includes a pair of differential outputs 80 and 82 which are coupled to the next gain stage in a similar manner.

The logarithmic amplifier of FIG. 6 includes two detector cells 60 and 84. Although not shown, an additional detector cell is required for each additional gain stage employed in the logarithmic amplifier. The detector cell 60, as shown in FIG. 4, has a pair of differential inputs 46 and 48 which are coupled to differential inputs 78 and 76, respectively, to detect the input signal $V_{IN}$ applied thereacross. The differential outputs 62 and 64 of the detector cell 60 are coupled to inputs 73 and 71, respectively, of the difference amplifier 70. Similarly, the detector cell 84 includes a pair of differential inputs 86 and 88 which are coupled to the differential outputs 82 and 80, respectively, of the gain stage 74 for detecting a signal produced thereby. The detector cell 84 also includes a pair of differential outputs 90 and 92 which are coupled to the inputs 73 and 71, respectively, of the difference amplifier 70.

In operation, the output signals produced at the first differential outputs (62 and 90) of the detector cells are combined or summed together and provided to the first one of the inputs (73) of the difference amplifier. The output signals of the second differential outputs (64 and 92) of the detector cells are combined or summed and provided to the second input (71) of the difference amplifier. The difference amplifier then determines the difference between the summed signals applied to its inputs, wherein the difference is indicative of the signal strength of the signal generated by the logarithmic amplifier. Moreover, the output current $I_{OUT}$ produces thereby is substantially zero when no signal $V_{IN}$ is applied to the logarithmic amplifier.

Figure 7:
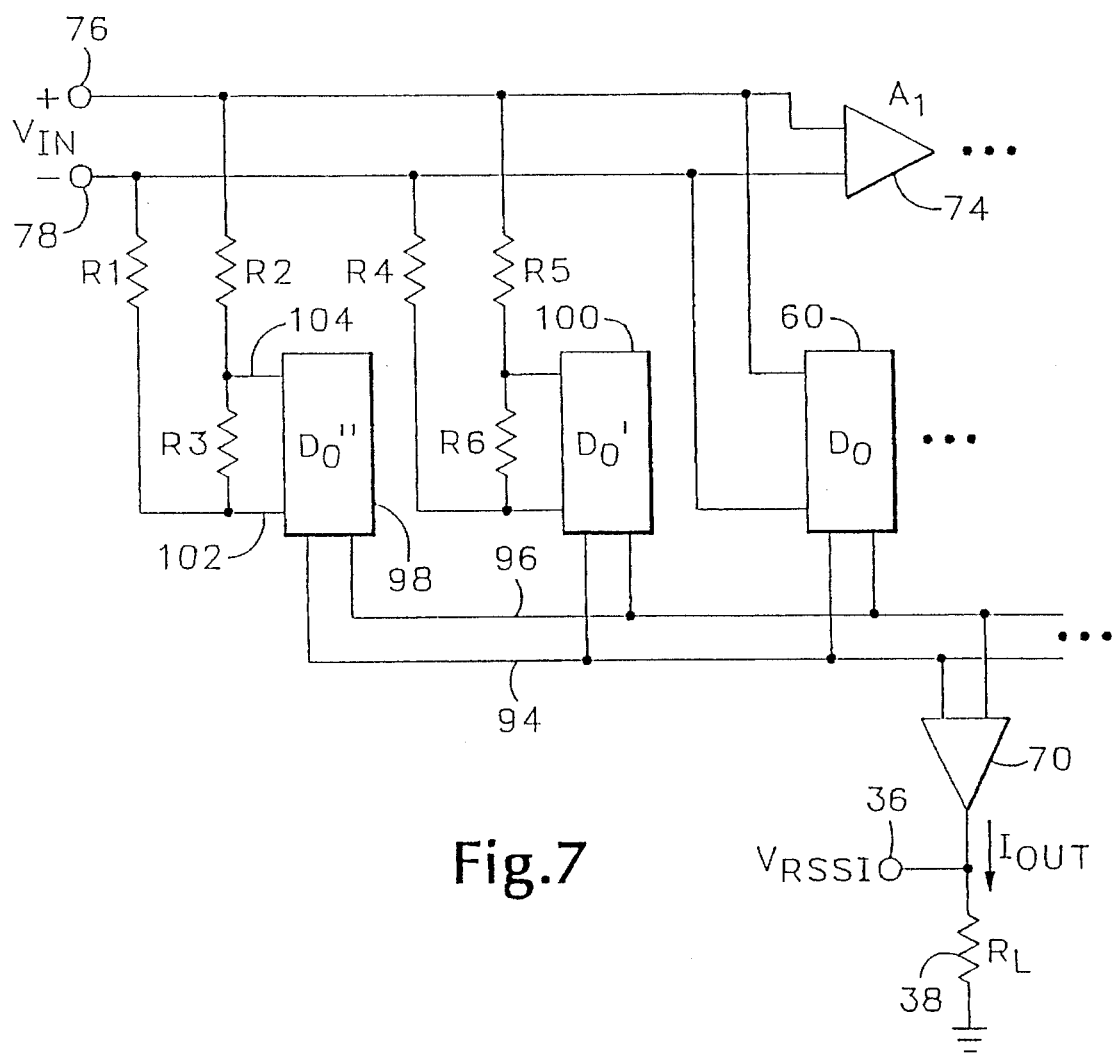
FIG. 7 is a schematic diagram of a portion of a logarithmic amplifier using the detector cells according to the invention.

Another aspect of the invention is shown in FIG. 7. In FIG. 7 two additional detector cells 98 and 100 are coupled to the differential inputs 76 and 78 of the logarithmic amplifier of FIG. 6. The detector cells 98 and 100 increase the operating range of the detector cells in that they detect larger signal swings of the input signal $V_{IN}$. The detector cells 98 and 100 are coupled to the difference amplifiers 70 in an identical manner as the detector cell 60. However, the detector cells 98 and 100 are coupled to the differential inputs 76 and 78 via an impedance network comprised of three resistors. For example, a resistor R1 is coupled between the differential inputs 78 and a first differential input 102 of the detector cell 98. A second resistor R2 is coupled between the differential input 76 and a second differential input 104 of the detector cell 98. A third resistor R3 is coupled across the first and second inputs of the detector cell 98. The impedance network for the detector cell 100, comprised of resistors R4–R6, is coupled between the differential inputs 76 and 78 and the detector cell 100 in a substantially identical manner. The impedance network attenuates the input signal $V_{IN}$ applied across the differential inputs 76 and 78 and thereby increases the operating range over which the detector cells can detect the input signal $V_{IN}$. This allows the input signal $V_{IN}$ to swing across a wider operating range while still maintaining the accuracy of the detector circuit. Although three detector cells (60, 100, 104) are shown in FIG. 7, any number of detector cells can be used, where each has an appropriate impedance network coupled thereto.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A logarithmic amplifier comprising:
   a plurality of N serially connected gain stages each having differential inputs and differential outputs, wherein N is an integer greater than one, and wherein the inputs of a first gain stage form a differential logarithmic amplifier input for receiving an input signal and the outputs of a last gain stage form a differential logarithmic amplifier output;
   a plurality of N detector cells each having differential inputs coupled to the differential outputs of a corresponding gain stage and having differential outputs; and
   a difference amplifier having an inputs coupled to the outputs of each of the detector cells and having an output for producing an output signal indicating the strength of the input signal.

2. A logarithmic amplifier according to claim 1 further comprising a (N+1)th detector cell having differential inputs coupled to the logarithmic amplifier inputs and differential outputs coupled to the difference amplifier.

3. A logarithmic amplifier according to claim 2 further comprising:
   a (N+2)nd detector cell having differential inputs and having differential outputs coupled to the difference amplifier; and
   an impedance network coupled between the logarithmic amplifier inputs and the (N+2)nd detector cell inputs.

4. A logarithmic amplifier according to claim 3 wherein the impedance network includes:
   a first resistor coupled between a first one of the differential pair of logarithmic amplifier inputs and a first one of the differential inputs of the (N+2)nd detector cell;
   a second resistor coupled between a second one of the differential pair of logarithmic amplifier inputs and a second one of the differential inputs of the (N+2)nd detector cell; and
   a third resistor coupled between the differential inputs of the (N+2)nd detector cell.

5. A logarithmic amplifier according to claim 4 further comprising:
   a (N+3)rd detector cell having differential inputs and having differential outputs coupled to the difference amplifier; and
   means coupled between the logarithmic amplifier inputs and the (N+3)rd detector cell inputs for increasing an operating range of the input signal.

6. A logarithmic amplifier according to claim 1 wherein each of the plurality of N detector cells includes:
   a first transistor having a first terminal, a second terminal, and a control terminal;
   a second transistor having a first terminal, a second terminal, and a control terminal, wherein the first terminals of the first and second transistors form the output of the detector cell;
   a third transistor having a first terminal, a second terminal, and a control terminal, wherein the first terminal of the third transistor is coupled to the first terminal of the first transistor, and wherein the control terminals of the first and third transistors form the differential inputs of the detector cell; a current source coupled to the second terminals of the first, second, and third transistors;
   a first resistor coupled between the control terminals of the first and second transistors; and
   a second resistor coupled between the control terminals of the second and third transistors.

7. A logarithmic amplifier according to claim 1 wherein each of the plurality of N serially connected gain stages includes a limiter circuit.

8. A logarithmic amplifier according to claim 1 wherein each of the plurality of N serially connected gain stages includes a differential pair of transistors configured as a transconductance stage.

9. A logarithmic amplifier according to claim 1 further including a load coupled to the output of the difference amplifier.

10. A logarithmic amplifier according to claim 9 wherein the load comprises a resistor.

11. A detector cell for detecting the strength of an input signal applied to a logarithmic amplifier comprising:
    a first transistor having a first terminal, a second terminal, and a control terminal;
    a second transistor having a first terminal, a second terminal, and a control terminal, wherein the first terminals of the first and second transistors form a pair of differential outputs of the detector cell;
    a third transistor having a first terminal, a second terminal, and a control terminal, wherein the first terminal of the third transistor is coupled to the first terminal of the first transistor, and wherein the control terminals of the first and third transistors form a pair of differential inputs of the detector cell;
    a current source coupled to the second terminals of the first, second, and third transistors;
    a first resistor coupled between the control terminals of the first and second transistors; and
    a second resistor coupled between the control terminals of the second and third transistors,
    wherein the current through each of one of the pair of differential outputs is substantially equal when no input signal is applied across the pair of differential inputs.

12. A detector cell according to claim 11 wherein the first, second, and third transistors each have an emitter and wherein the ratio of the emitter area of the second transistor to the first transistor is approximately equal to A:1, where A is equal to a number greater than one.

13. A detector cell according to claim 12 wherein the first, second, and third transistors each have an emitter and wherein the ratio of the emitter area of the second transistor to the third transistor is approximately equal to A:1, where A is equal to a number greater than one.

14. A detector cell according to claim 13 wherein A is approximately equal to 2.

15. A detector cell according to claim 11 wherein the resistances of the first and second resistors are approximately equal.

16. A detector cell according to claim 11 wherein the first, second,and third transistors are bipolar junction transistors (BJTs).

17. A method of determining a signal strength of a signal generated by a logarithmic amplifier having a plurality of serially connected gain stages each having a pair of differential inputs and a pair of differential outputs, and a plurality of detector cells each having a pair of differential inputs coupled to the differential output pair of a corresponding gain stage and a pair of differential outputs including first and second differential outputs, each detector cell producing first and second output signals on their first and second differential outputs, respectively, the method comprising:

summing the first output signals generated at the first differential outputs of the detector cells;

summing the second output signals generated at the second differential outputs of the detector cells; and determining the difference between the summed first output signals and the summed second output signals, wherein the difference is proportional to the signal strength of the signal generated by the logarithmic amplifier and wherein the difference is approximately equal to zero when there is no signal applied to the logarithmic amplifier.

18. A method of determining a signal strength of a signal generated by a logarithmic amplifier according to claim 17 wherein the step of summing the first output signals generated at the first differential outputs of the detector cells includes coupling the first differential outputs of the plurality of detector cells to a first differential input of a difference amplifier.

19. A method of determining a signal strength of a signal generated by a logarithmic amplifier according to claim 18 wherein the step of summing the second output signals generated at the second differential outputs of the detector cells includes coupling the second differential outputs of the plurality of detector cells to a second differential input of the difference amplifier.

20. A method of determining a signal strength of a signal generated by a logarithmic amplifier according to claim 17 wherein the step of determining the difference between the summed first output signals and the summed second output signals includes subtracting the summed signals appearing at the first and second differential inputs of a difference amplifier.

* * * * *

UNITED STATES PATENT AND TRADEMARK OFFICE
CERTIFICATE OF CORRECTION

PATENT NO. : 5,489,868
DATED : February 6, 1996
INVENTOR(S) : Barrie Gilbert

It is certified that error appears in the above-indentified patent and that said Letters Patent is hereby corrected as shown below:

In the Abstract, line 9, change "Ihd D" to --$I_D$--.

Signed and Sealed this

Twenty-seventh Day of May, 1997

Attest:

BRUCE LEHMAN

*Attesting Officer*  *Commissioner of Patents and Trademarks*